United States Patent [19]

Behun et al.

[11] Patent Number: 4,914,814
[45] Date of Patent: Apr. 10, 1990

[54] PROCESS OF FABRICATING A CIRCUIT PACKAGE

[75] Inventors: John R. Behun; William R. Miller, both of Poughkeepsie; Bert H. Newman, Carmel; Edward L. Yankowski, Hyde Park, all of N.Y.

[73] Assignee: International Business Machines Corporation, Armonk, N.Y.

[21] Appl. No.: 347,305

[22] Filed: May 4, 1989

[51] Int. Cl.⁴ .............................................. H01R 9/09
[52] U.S. Cl. ...................................... 29/843; 174/263; 361/400; 361/406
[58] Field of Search ............... 174/68.5; 361/400, 403, 361/406; 29/825, 830, 843

[56] References Cited

U.S. PATENT DOCUMENTS 4,581,680  4/1986  Garner ......................... 174/68.5 X
4,783,722  12/1988 Osaki et al. .................. 174/68.5 X

FOREIGN PATENT DOCUMENTS 8201295  4/1982  World Int. Prop. O. .......... 361/406

OTHER PUBLICATIONS

IBM Tech. Disel Bull, vol. 14, No. 8, Jan. 1972, p. 2297 by J. E. Martyak et al. (361/400).

Primary Examiner—Carl J. Arbes
Attorney, Agent, or Firm—Yen S. Yee

[57] ABSTRACT

A low cost process for fabricating solder column interconnectons for an electronic package is described. The process includes the step of filling an array of pin holes in a pin mold with a lead/tin solder, which array of pin holes is in substantial registration with the array of conductive pads on one side of a chip carrier; heating the lead/tin solder in the pin mold such that the solder becomes molten and coalesces with the array of conductive pads of the chip carrier, thereby forming an array of miniature pins bonded to the array of conductive pads of the chip carrier; joining circuit components to the other side of the chip carrier; and reflowing an eutectic lead/tin solder paste screened to the corresponding array of conductive pads of a circuit board to bond the free ends of the array of miniature pins of the carrier to the corresponding array of conductive pads, thereby forming the solder column connnections between the chip carrier and the circuit board. The process is suitable for mass production of reliable, high-density electrical interconnections between a chip carrier and a supporting circuit board.

20 Claims, 1 Drawing Sheet

PROCESS OF FABRICATING A CIRCUIT PACKAGE

TECHNICAL FIELD

This invention relates generally to electronic packaging and method of manufacturing for same, and more particularly, to electrical interconnections between a ceramic substrate carrier and a supporting circuit board, and a process for making such electrical interconnections.

BACKGROUND ART

A state-of-the-art electronic packaging generally contains many levels of packages and interconnections. The first level package may connect one or more silicon chips on a ceramic substrate carrier. A second level package may interconnect one or more such ceramic substrate carriers on an organic board. In order to achieve high conductivity for power distribution, desirable low electrical inductance for high speed and low noise, proper mechanical properties for acceptable mechanical support, and fatigue characteristics, as well as manufacturability considerations, heretofore ceramic substrate carriers are provided with rigid metal pins which are brazed on the ceramic with a suitable braze material such as a gold-tin alloy. Ceramic substrates with such rigid pins are subsequently plugged into a connector or wave soldered to an array of plated through holes on the organic board. The foregoing described connection system has disadvantages of high cost associated with the braze material, the rigid metal pins, the pin connectors or plated through holes, which holes also limit the number of wiring channels available in the board.

U.S. Pat. Nos. 3,401,126 and 3,429,040 issued to L. F. Miller and assigned to the assignee of the present patent application describes in detail the controlled collapse connection technique of face-down bonding of semiconductor chips to a carrier, i.e. forming a first level package interconnection. In general, what is described in those patents is the formation of a malleable pad of metallic solder on the semiconductor chip contact site and solder joinable sites on the conductors on the chip carrier. The chip carrier joinable sites are surrounded by non-soluable barriers so that when the solder on the carrier sites and the semiconductor device contact sites melt and merge, surface tension holds the semiconductor chip suspended above the carrier.

U.S. Pat. No. 4,545,610 to Mark Lakritz, et al, and assigned to the assignee of the present patent application teaches an improved process over the above described Miller patents for forming elongated solder terminals to connect a plurality of pads on a semiconductor device to a corresponding plurality of pads on a supporting substrate by, forming a means to maintain a predetermined vertical spacing between the semiconductor and the supporting substrate outside the area of the pads, forming and fixing solder extenders to each of the solder vertical pads on the substrate or the device to be joined, positioning the semiconductor device provided with solder mounds on the solder mountable pads on the supporting substrate with the solder mound in registry and with the pads on the substrate with the solder extenders positioned therebetween, the means to maintain vertical spacing located between and in abutting relation to the device and substrate, and heating the resulting assembly to fully melt both the solder mounds and the solder extenders while maintaining a predetermined spacing using stand-offs thus forming a plurality of hour-glass shaped elongated connections for a first level package.

Recently a substantial effort has been directed at extending the first level solder interconnection technique for chips and carriers to the second level interconnections of carriers and supporting higher level packages, such as a circuit board. For example, U.S. Pat. No. 4,664,309, issued on May 12, 1987 to Leslie J. Allen, et al, entitled, "Chip Mounting Device", teaches an interconnection preform placement device having a retaining member with a predefined pattern of holes in which are positioned preforms of joint-forming materials such as solder. The device is placed between parallel patterns of electrically conductive elements on an electronic component and a circuit board to effect the bonding of the conductive elements with the preforms. The preforms maintain their predefined configuration during the bonding and retain their original shape after the connection process. According also to the teaching of the companion U.S. Pat. No. 4,705,205, the joint-forming materials may be a filled solder composition or a support solder having "wool" or wire or mesh, which substantially maintain their physical shape when the solder component of the joint-forming material is molten.

U.S. Pat. No. 4,352,449 issued to Peter M. Hall, et al, entitled "Fabrication of Circuit Packages", teaches a method for mounting a chip carrier on a supporting substrate, wherein solder preforms are applied to contact pads on either the chip carrier or substrate. After contact pads of both the carrier and the substrate are brought into contact with the solder preforms, the bond is formed by heating the final assembly thereby forming the connection by totally melting the solder preforms.

U.S. Pat. No. 4,332,341 issued to Richard H. Minetti entitled "Fabrication of Circuit Packages using Solid Phase Solder Bonding", teaches a method of forming circuit packages including the bonding of the chip carrier into a supporting substrate, wherein solid solder preforms are applied to contact members on the component or substrate or both, the preforms are bonded to the contact members by heating to a temperature below the melting point of solder while applying force to the preforms, thereby forming a connection without melting the preforms.

DISCLOSURE OF THE INVENTION

It is a principal object of the present invention to provide a process for fabricating an array of high density electrical interconnections between a ceramic carrier and a supporting circuit board.

It is also an object of the present invention to provide a low cost process for fabricating electrical interconnections between a ceramic carrier and a supporting circuit board.

It is generally an object of the present invention to provide an improved electrical interconnection for electronic packaging.

Still another object of the present invention is to provide an improved electrical interconnection which could withstand the stresses associated with thermal expansion mismatch between a ceramic carrier and a supporting circuit board.

These and other objects of the present invention could be achieved by a process for fabricating a circuit package comprising the steps of providing a carrier having on one side thereof, a first array of conductive pads; placing a pin mold having a corresponding array of pin holes in alignment with said carrier such that said corresponding array of pin holes is in substantial registration with said first array of conductive pads; filling said array of pin holes in said pin mold with a first solder having a given melting point; heating said first solder in said pin mold such that said first solder becomes molten and coalesces with said first array of conductive pads, thereby forming an array of miniature pins bonded to said first array of conductive pads of said carrier; joining circuit components to the other side of said carrier; placing a supporting substrate having on one side thereof a second corresponding array of conductive pads screened with a second solder having a melting point substantially lower than said given melting point, in alignment with said carrier such that said second corresponding array of conductive pads is in substantial registration with the free ends of said array of miniature pins of said carrier; and reflowing said second solder to bond said array of miniature pins to said second corresponding array of conductive pads, thereby forming solder column connections between said carrier and said supporting substrate.

The nature, principle, utility, other objects, features and advantages of this invention will be apparent from the following more particular description of the invention, as illustrated in the accompanying drawings.

BRIEF DESCRIPTION OF THE DRAWINGS

The details of the invention will be described in connection with the accompanying drawings.

BEST MODE FOR CARRYING OUT THE INVENTION

Figure 1:
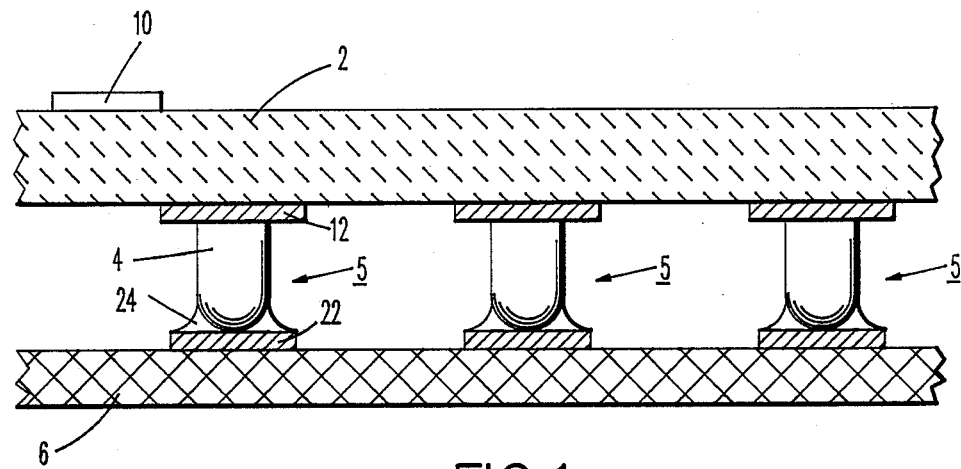
FIG. 1 is a cross-sectional view of a single pin interconnecting the metallized pads of a ceramic chip carrier and an organic board in accordance with the present invention.

Referring to FIG. 1, there is shown an electronic package comprising a ceramic substrate carrier 2 having a large array of miniature pins 4 forming an array of malleable solder column connections 5 to an organic board 6 in accordance with the teaching of the present invention. In general, organic board 6 may be connected to one more more ceramic substrate carriers 2, via one or more large array of miniature pins 4, which carrier 2 may have thereon one or more semiconductor chips 10. As used herein and below the term "array" shall mean a symmetrical row and column of elements, but shall include depopulated asymmetrical arrangements and generally a plurality of elements.

Figure 2:
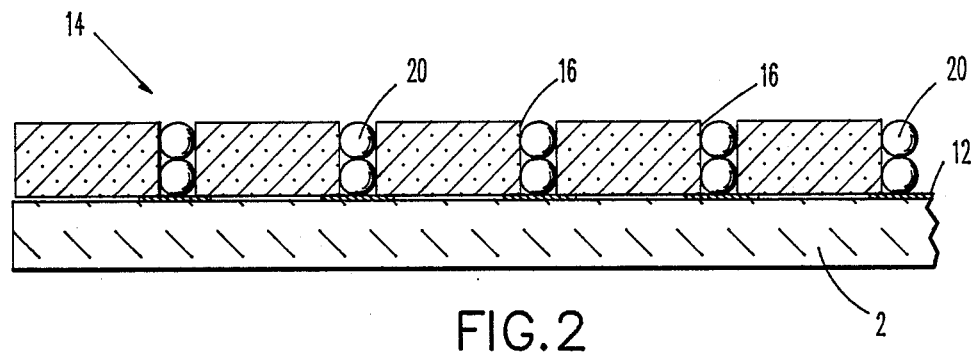
FIGS. 2-3 show cross-sectional views of a ceramic carrier with a pin mold at various states in the process for fabricating an array of solder column connections in accordance with the present invention.

On one side of the ceramic substrate carrier 2 there is provided a first array of metallized pads 12 preferably made of an alloy of molybdenum or tungsten, with nickel and gold. As illustrated in FIG. 2, substrate carrier 2 is placed with this side up, whereupon, pin mold 14 is placed on substrate carrier 2. Pin mold 14 is preferably made of thermal coefficient of expansion matched graphite or similar material having the characteristics of thermal coefficient of expansion matching to the ceramic substrate, not wettable by the solder, and able to withstand the temperatures used, and is provided with a corresponding array of pin through holes 16. Pin mold 14 is placed in alignment with substrate carrier 2 such that the corresponding array of pin through holes 16 is in registration with the first array of metallized pads 12. The array of pin through holes 16 in pin mold 14 is filled with a predetermined amount of lead/tin solder 20 with a composition of 90% lead and 10% tin, preferably in ball form, although other acceptable forms such as wire, are also possible.

Figure 3:
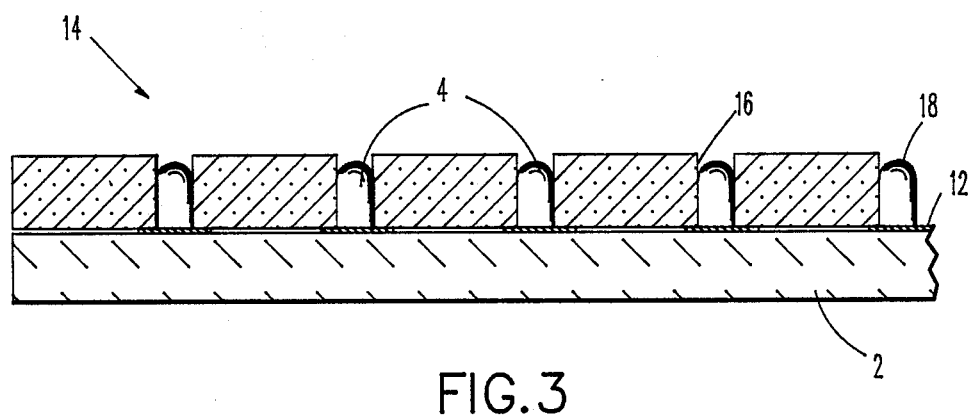

The entire pin mold 14 on substrate carrier 2 assembly is passed through a furnace heating the assembly to a preferred temperature of approximately 320° C. for 1.5 to 3 minutes, attaining a peak temperature between 330°-355° C. The solder 20 in pin mold 14 becomes molten and coalesces with the metallized pads 12 forming a metallurgical bonds thereto, thereby forming the array of miniature pins 4 bonded to the first array of metallized pads 12 of substrate carrier 2. The formation of the array of miniature pins 4 by reflowing the solder 20 in pin through holes 16 give rise to a dome-like shape 18 at the free ends of each miniature pins 4 as illustrated in FIG. 3. Variability of the overall height of the miniature pins 4 in the array could be controlled by controlling the size of the solder balls 20 or the length and/or diameter of the solder wire used, as well as the diameter of the pin through holes 16 of pin mold 14. These parameters could be maintained to acceptable tolerances. Alternatively, to achieve uniform height, the array of miniature pins 4 could be shaved by a cutting fixture using conventional known techniques. For instance, array of miniature pins 4 could be placed in a suitable mold and then shaved to a uniform height.

The array of miniature pins 4 in accordance with the present teaching has a pin height to diameter ratio of approximately 2:1, and could have a pin diameter tapering from approximately the I/O pad 12 diameter, typically about 40 mils, to a diameter approaching 15 mils. For example, typically in a 50 mil centered pin array 4, the pin height of about 60 mils has been used; and in a 100 mil centered pin array 4, pin height ranges from 100 mils to 120 mils have been typical. Such malleable pin array 4 with relatively large pin height to diameter ratio could better accommodate stresses resulting from thermal expansion mismatch between substrate carrier 2 and organic board 6.

Chips 10 are joined and/or reworked with the array of pins 4 in pin mold 14. Chips 10 are joined with low tin solder, having a preferred composition of 97% lead and 3% tin, to the substrate carrier 2 in a heat cycle with a preferred temperature range of 330°-355° C., during which, the array of pins 4 will melt and be reformed in the pin holes 16 of pin mold 14.

Substrate carrier 2 having an array of miniature pins 4 on one surface and chips 10 mounted on the other surface is then placed upon organic board 6. Board 6 has been provided thereon with a second corresponding array of metallized pads 22 (See FIG. 1) screened with eutectic lead/tin solder paste 24 having a preferred composition of 37% lead and 63% tin. Substrate carrier 2 is placed in alignment with board 6 such that the array of pins 4 is in substantial registration with the second corresponding array of metallized pads 22 on board 6. Some degree of self-alignment is evidenced during this joining operation which is described next. The connection to the board 6 is made by passing the substrate carrier 2, the array of pin 4 and board 6 assembly through a furnace, such as a vapor phase furnace, at a temperature of approximately 220° C. for approximately 1.5 to 2 minutes. During this low heat cycle, the eutectic solder 24 melts and forms a metallurgical bond between the metallized pads 22 and the free ends of the array of pins 4. The array of pins 4 maintains its shape, since the pins 4 do not melt and the result is an array of malleable solder column connections 5 with good mechanical and electrical characteristics. The fabrication process in accordance with the present invention is suitable for mass production. Since only low cost metallic alloys are required for the fabrication of the solder column connections, the resulting interconnection is relatively low cost compared with the conventional pin array interconnection.

While Applicants' preferred embodiment for their invention is shown and described as utilizing a lead/tin metallic alloy, it is clear that other alternatives, for example, other IVa-Va metallic alloys, including metallic alloys such as tin/bismuth and tin/antimony are also possible.

Although Applicants' preferred embodiment shows lead/tin solder 20 over a 90% lead and 10% tin composition by weight, and a eutectic lead/tin paste 24 with a composition of 37% lead and 63% tin, it is understood that the present invention is not restricted to a particular composition. For solder 20, a range of lead from 97% to 85% and tin from 3% to 15% composition; and for solder 20, a range of lead from 30% to 45%, and tin the the range of 70% to 55% composition, are also possible and applicable, as long as the melting point of solder paste 24 is substantially lower than that of solder 20.

From the preceding detailed description of Applicants' invention, it is seen that electronic packaging fabricated according to the teaching of the present invention have advantages heretofore not possible to achieve. In addition to the variations and modifications of Applicants' described preferred embodiments, which have been suggested, many other variations and modifications will be apparent to those skilled in this art, and accordingly, the scope of Applicants' invention is not to be construed to be limited to the particular embodiments shown or suggested.

Having thus described Applicants' invention, what is claimed as new, and is desired to be secured by Letters Patent is:

1. A process for fabricating a circuit package comprising the steps of:
   providing a carrier having on one side thereof a first array of conductive pads;
   placing a pin mold having a corresponding array of pin holes in alignment with said carrier such that said corresponding array of pin holes is in substantial registration with said first array of conductive pads;
   filling said array of pin holes in said pin mold with a first solder having a given melting point;
   heating said first solder in said pin mold such that said first solder becomes molten and coalesces with said first array of conductive pads, thereby forming an array of miniature pins bonded to said first array of conductive pads of said carrier;
   joining circuit components to the other side of said carrier;
   placing a supporting substrate having on one side thereof a second corresponding array of conductive pads, screened with a second solder having a melting point substantially lower than said given melting point, in alignment with said carrier such that said second corresponding array of conductive pads is in substantial registration with the free ends of said array of miniature pins of said carrier; and
   reflowing said second solder to bond the free ends of said array of miniature pins to said second corresponding array of conductive pads, thereby forming solder column connections between said carrier and said supporting substrate.

2. A process for fabricating a circuit package as set forth in claim 1, wherein first said solder and said second solder are IVa-Va metal alloys.

3. A process for fabricating a circuit package as set forth in claim 2, wherein said first solder is a lead/tin solder.

4. A process for fabricating a circuit package as set forth in claim 3, wherein said first solder is a lead/tin solder with a composition, by weight, of lead in the range of 97%-85%, and tin in the range of 3%-15%.

5. A process for fabricating a circuit package as set forth in claim 2, wherein said second solder is a lead/tin solder.

6. A process for fabricating a circuit package as set forth in claim 5, wherein said second solder is a lead/tin solder with a composition, by weight, of lead in the range of 30%-45%, and tin in the range of 70%-55%.

7. A process for fabricating a circuit package as set forth in claim 6, wherein said second solder is a eutectic mixture.

8. A process for fabricating a circuit package as set forth in claim 7, wherein said step of joining circuit components is accomplished by using a lead/tin solder having a composition, by weight, of 97%-95% lead and 3%-5% tin.

9. A process for fabricating a circuit package as set forth in claim 8, wherein said carrier is a ceramic carrier, and said supporting substrate is an organic circuit board.

10. A process for fabricating a circuit package as set forth in claim 5, further including the step of cutting said array of miniature pins to a substantial uniform height before said reflowing step.

11. A process for fabricating a circuit package comprising the steps of:
    providing a carrier having on one side thereof a first array of conductive pads;
    placing a pin mold having a corresponding array of pin holes in alignment with said carrier such that said corresponding array of pin holes is in substantial registration with said first array of conductive pads;
    filling said array of pin holes in said pin mold with a first solder having a given melting point;
    heating said first solder in said pin mold such that said first solder becomes molten and coalesces with said first array of conductive pads, thereby forming an array of miniature pins bonded to said first array of conductive pads of said carrier;
    placing a supporting substrate having on one side thereof a second corresponding array of conductive pads, screened with a second solder having a melting point substantially lower than said given melting point, in alignment with said carrier such that said second corresponding array of conductive pads is in substantial registration with the free ends of said array of miniature pins of said carrier; and
    reflowing said second solder to bond the free ends of said array of miniature pins to said second corresponding array of conductive pads, thereby forming solder column connections between said carrier and said supporting substrate.

12. A process for fabricating a circuit package as set forth in claim 11, wherein first said solder and said second solder are IVa-Va metal alloys.

13. A process for fabricating a circuit package as set forth in claim 12, wherein said first solder is a lead/tin solder.

14. A process for fabricating a circuit package as set forth in claim 13, wherein said first solder is a lead/tin solder with a composition, by weight, of lead in the range of 97%-85%, and tin in the range of 3%-15%.

15. A process for fabricating a circuit package as set forth in claim 12, wherein set second solder is a lead/tin solder.

16. A process for fabricating a circuit package as set forth in claim 15, wherein said second solder is a lead/tin solder with a composition, by weight, of lead in the range of 30%-45%, and tin in the range of 70%-55%.

17. A process for fabricating a circuit package as set forth in claim 16, wherein said second solder is a eutectic mixture.

18. A process for fabricating a circuit package as set forth in claim 17, wherein said step of joining circuit components is accomplished by using a lead/tin solder having a composition, by weight, of 97%-95% lead and 3%-5% tin.

19. A process for fabricating a circuit package as set forth in claim 18, wherein said carrier is a ceramic carrier, and said supporting substrate is an organic circuit board.

20. A process for fabricating a circuit package as set forth in claim 15, further including the step of cutting said array of miniature pins to a substantial uniform height before said reflowing step.

* * * * *